United States Patent
Chang et al.

(10) Patent No.: US 11,137,434 B2
(45) Date of Patent: Oct. 5, 2021

(54) ACTIVE MEASURING PROBE FOR EMI DETECTION

(71) Applicant: NATIONAL APPLIED RESEARCH LABORATORIES, Taipei (TW)

(72) Inventors: Yin-Cheng Chang, Hsinchu (TW); Da-Chiang Chang, Hsinchu (TW)

(73) Assignee: National Applied Research Laboratories, Taipei (TW)

( * ) Notice: Subject to any disclaimer, the term of this patent is extended or adjusted under 35 U.S.C. 154(b) by 0 days.

(21) Appl. No.: 15/930,916

(22) Filed: May 13, 2020

(65) Prior Publication Data

US 2021/0239747 A1  Aug. 5, 2021

(30) Foreign Application Priority Data

Jan. 30, 2020   (TW) .................. 109102712

(51) Int. Cl.
  *G01R 31/00*   (2006.01)
(52) U.S. Cl.
  CPC .................. *G01R 31/002* (2013.01)
(58) Field of Classification Search
  CPC .................................................. G01R 31/002
  See application file for complete search history.

(56) References Cited

U.S. PATENT DOCUMENTS

| | | | | |
|---|---|---|---|---|
| 4,088,962 A * | 5/1978 | Trilling | ............... | H03F 3/45085 330/103 |
| 7,019,544 B1 * | 3/2006 | Jacobs | ............... | G01R 1/06772 324/715 |
| 2002/0033706 A1 * | 3/2002 | Khazei | ............... | G01R 29/0821 324/750.22 |
| 2012/0119757 A1 * | 5/2012 | Nakamura | ........... | G01R 31/001 324/613 |
| 2015/0061698 A1 | 3/2015 | Vineesh et al. | | |
| 2015/0268272 A1 * | 9/2015 | Chang | ................ | G01R 1/06766 324/149 |

FOREIGN PATENT DOCUMENTS

| | | |
|---|---|---|
| EP | 0607481 A1 | 7/1994 |
| WO | 2002054967 A1 | 7/2002 |

OTHER PUBLICATIONS

English Translation of Taiwan Search Report 109102712 (dated May 31, 2021) (Year: 2021).*
Official Action Issued by Foreign Patent Office in Counterpart Application No. 109102712/11020512990 (First Official Action), Taiwan (TW) dated May 31, 2021.
Official Action Issued by Foreign Patent Office in Counterpart Application No. 109102712, Taiwan (TW) dated May 31, 2021.

* cited by examiner

*Primary Examiner* — Paresh Patel
(74) *Attorney, Agent, or Firm* — Rosenberg, Klein & Lee

(57) ABSTRACT

The present invention relates to an active measuring probe for EMI detection comprising a first connecting member, an impedance element, an amplifier and a second connecting member. The first connecting member is coupled to one terminal of the impedance element and an input terminal of the amplifier. The other terminal of the impedance element is coupled to a ground terminal. The second connecting member is coupled to an output terminal of the amplifier.

4 Claims, 6 Drawing Sheets

FIG. 4 --Prior Art--

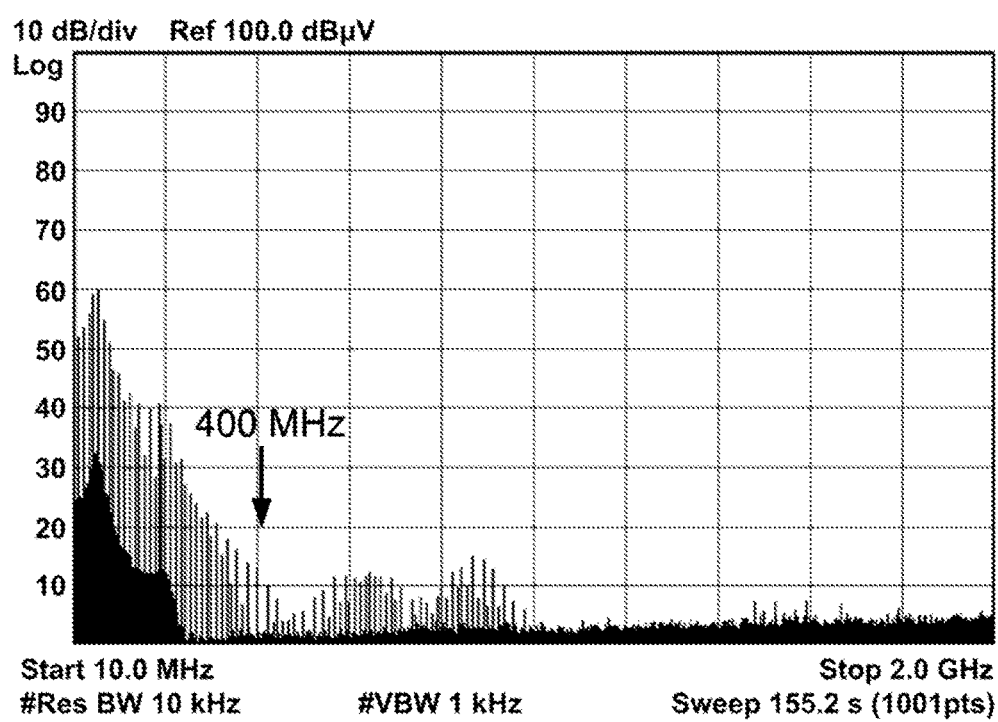
FIG. 6 --Prior Art--

ACTIVE MEASURING PROBE FOR EMI DETECTION

FIELD OF THE INVENTION

The present invention relates generally to a measuring probe for electromagnetic interference (EMI) detection, and particularly to an active measuring probe for EMI detection.

BACKGROUND OF THE INVENTION

As technologies are developed rapidly, the increase of the operating frequency and the transistor count in integrated circuits (IC) operated in the low voltages leads to more noise and interference. Consequently, semiconductor suppliers are normally required to provide the testing information about EMI in ICs. Compared to test EMI and electromagnetic susceptibility (EMS) in the system level, IC level testing will be more effective because it can avoid complicated conditions and assess the root causes of electromagnetic emission (EME) incompliance. By using the IC level measurement, the electromagnetic compliance (EMC) among different testing levels, including IC, PCB, module, and system, can be compared. The comparison is advantageous to shortening the development cycle of products.

The International Electrotechnical Commission (IEC) announced two series of measurement standards for assessing IC-level EME and EMS, namely, IEC 61967 [1] and IEC 62132 [2]. Based on these standards, different methods are proposed. For example, the transverse electromagnetic (TEM) cell method [3] [4] uses a shield hood to collect the EME radiation from the device under test (DUT). The surface scanning method [5] [6] captures the near-filed electromagnetic wave of the DUT. Alternatively, the magnetic probe [7][8] measures conductive EME and receives the magnetic field generated by the current along the metal wires designed according to the measurement purpose. Among various probe choices, 1Ω/150Ω probes can be adopted [9][10] for performing the direct coupling method. By connecting to the DUT by a physical method, the repeatability of the measurement results can be ensured to be high.

The most important step to get reliable measurement results using the direct coupling method is to implement the probe compliant with the strict IEC standards. To meet the requirement, a 1Ω current probe should be adopted, which is a special challenge. For example. By connecting multiple resistors in parallel [11], the problem of reduced frequency response due to the parasitic effect can be improved and a current probe with 1 GHz bandwidth compliant with the IEC standards can be built. Nonetheless, a 1Ω current probe still faces a problem: for a passive probe, the loss is relatively large. In general, the lowest voltage of the DUT is adopted as the testing point. Thereby, the amplitude of the extracted signals is normally very small. According to the IEC standards [1][2], in which the resolution bandwidth (RBW) should be 100 kHz and the video bandwidth (VBW) should be 10 kHz (10:1 ratio), the voltage levels of certain high-frequency interference might be close to or even lower than the noise level of the DUT and hence making measurement not possible. In addition, if the RBW of the frequency analyzer is set to very narrow (as low as several hundred hertz or even lower) in order to measure such kind of low-voltage interference signals, the measurement will be extremely time-consuming and hence making large-scale production testing impossible.

Accordingly, the present provides an active measuring probe with integrated amplifier for measuring EMI in giga hertz.

SUMMARY

An objective of the present invention is to provide an active measuring probe. By the integration of accurate resistor design and amplifier, the loss of the measuring probe can be lower than 34 dB, which is the loss of measuring probe according to the prior art. For example, if the gain of the amplifier is 10 dB, the loss can be reduced to 24.2 dB. If the impedance element is omitted, the loss can possibly be further reduced to 18 dB. In addition, compared to the passive measuring probe according to the prior art, the active measuring probe has superior noise detection ability.

The present invention relates to an active measuring probe for EMI detection, which comprises a first connecting member, an impedance element, an amplifier, and a second connecting member. The first connecting member is coupled to one terminal of the impedance element and an input terminal of the amplifier. The other terminal of the impedance element is coupled to a ground terminal. The second connecting member is coupled to an output terminal of the amplifier.

BRIEF DESCRIPTION OF THE DRAWINGS

FIG. 6 shows a spectrum diagram for verifying the EMI measurement ability of the active measuring probe according to the prior art with the narrowed RBW and VBW setting.

DETAILED DESCRIPTION

Figure 1:
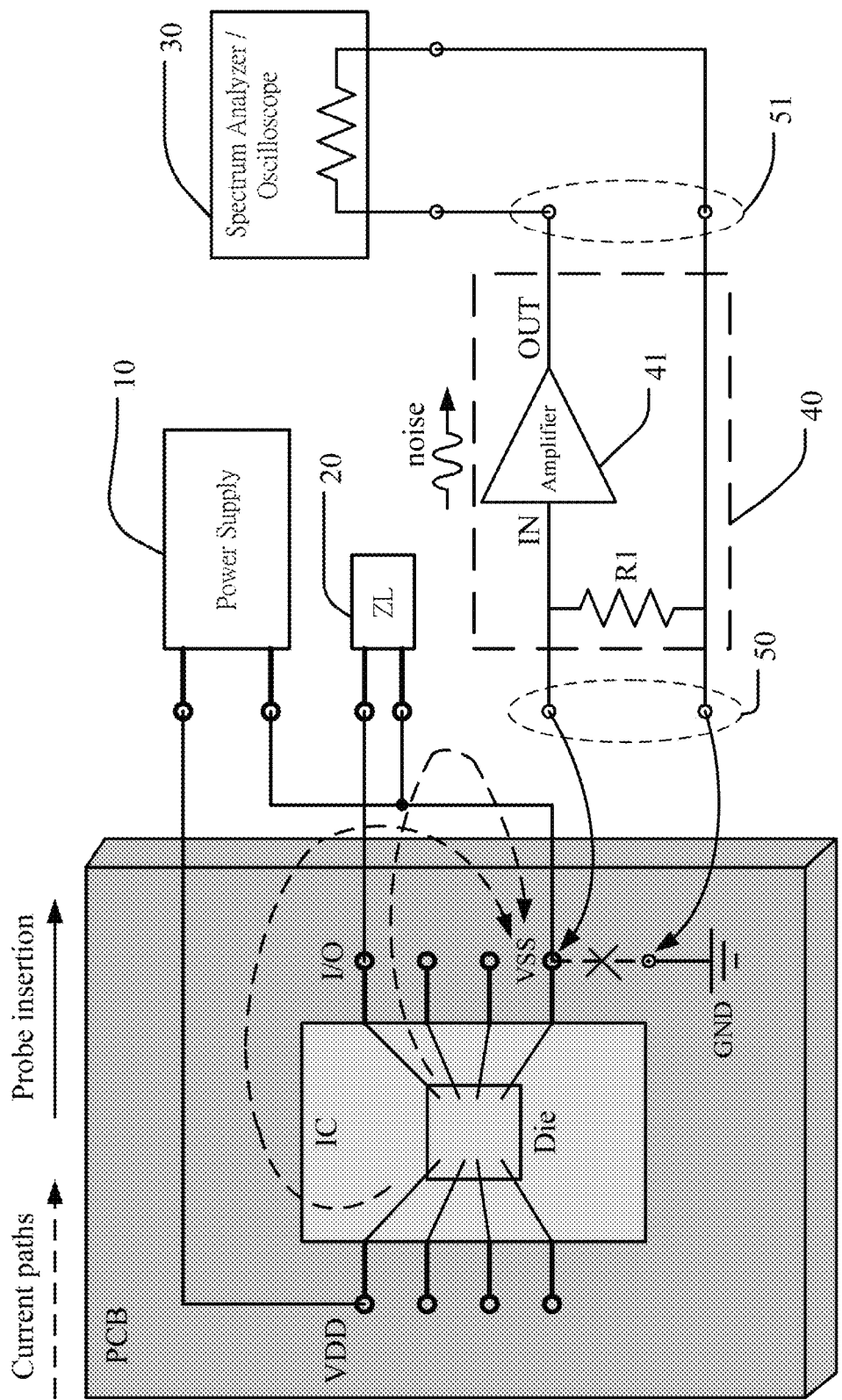
FIG. 1 shows a schematic diagram of the application of the active measuring probe according an embodiment of the present invention.

Please refer to FIG. 1, which shows a schematic diagram of the application of the active measuring probe according an embodiment of the present invention. As shown in the figure, a printed circuit board PCB includes an integrated circuit IC. The integrated circuit IC is coupled to a power supply 10 and a load 20. The power supply 10 supplies a supply voltage to a supply terminal VDD of the integrated circuit IC. The load 20 is coupled to the input/output terminal I/O of the integrated circuit IC. The power supply 10 and the load 20 are coupled to a low supply terminal VSS. Thereby, current paths (the dashed lines) are formed from the supply terminal VDD to the low supply terminal VSS and from the input/output terminal I/O to the low supply terminal VSS. The low supply terminal VSS of the integrated circuit IC is originally connected to a ground terminal GND. While measuring the noise of the integrated circuit IC, the connection between the low supply terminal VSS and the ground terminal GND is removed. The active measuring probe 40 is connected to the low supply terminal VSS and the ground terminal GND via a first connecting member 50 and is connected to a testing machine via a second connecting member 51. According to the present embodiment, the testing machine 30 can be a frequency analyzer (or an oscilloscope) 30.

The active measuring probe 40 comprises an impedance element and an amplifier 41. According to the present embodiment, the impedance element can be a first resistor R1 with resistance 0.1~2Ω. According to the present embodiment, first resistor R1 is selected as 1Ω. The first resistor R1 is coupled between the first connecting member 50 and the amplifier 41. The first resistor R1 can be connected in parallel with the first connected member 50. The gain of the amplifier 41 can be selected from 10 dB, 20 dB, or 0~50 dB. The gain of the amplifier 41 influences the loss of the active measuring probe. For example, if the gain of the amplifier 41 is increased, the loss of the active measuring probe will be decreased. The active measuring probe 40 can be assembled with the separate first and second connecting members 50, 51 to form a measurement instrument. The first connecting member 50 of the active measuring probe 40 measures the conductive transmitting structure (for example, the integrated circuit IC) by direct coupling. The first connecting member 50 of the active measuring probe 40 is inserted between the low supply terminal VSS of the integrated circuit IC and the ground terminal GND of the printed circuit board PCB for measuring the radio-frequency (RF) interference. The low impedance of the 1Ω resistor in the active measuring probe 40 ensures normal operation of the integrated circuit IC. Besides, since most return current will pass through the lead of the low supply terminal VSS of the integrated circuit IC, the active measuring probe 40 is allowed to measure the RF current passing through the 1Ω resistor by extracting and analyzing a small portion of interference signals. Moreover, the testing machine 30 measures the RF voltage generated by all the RF currents returning to the integrated circuit IC.

The weak interference on the integrated circuit IC ignored in normal testing might result in system EMI problems. The noise is mainly induced by the transient current in the integrated circuit IC. When the low-level transient current enters a high-impedance power delivery network (PDN), voltage ripples might appear apparent. In addition, the increase of PDN impedance with frequencies higher than 100 MHz is determined by the parasitic loop inductance. It is difficult to reduce the impedance value. Thereby, certain resonance might occur at unexpected frequencies. The active measuring probe 40 according to the present invention can be used to measure the weak interference in the IC level that is ignored in normal testing. Then the system EMI problems can be solved.

Moreover, simultaneous switching in the high-speed integrated circuit IC will result in transient currents generated at the baseband frequency and the harmonics. The signals lead by the transient current will be transmitted in a broad frequency range and becoming the potential noises. If the impedance of the PDN is not kept low enough on the printed circuit board PCB, the return current on the ground path will induce transient voltages on the ground path. Thereby, the ground bouncing will influence the operations of the other circuit modules or even the whole system and leading to EMI problems. Accordingly, by using the active measuring probe 40 with 1Ω low impedance according to the present invention, the signal strength and frequency range of interference can be identified. The measured information can be applied not only to the layout of the printed circuit board PCB for EMC optimization but also to totally understanding the interference generated in the high-speed integrated circuit IC, which can be references for system design.

Figure 2:
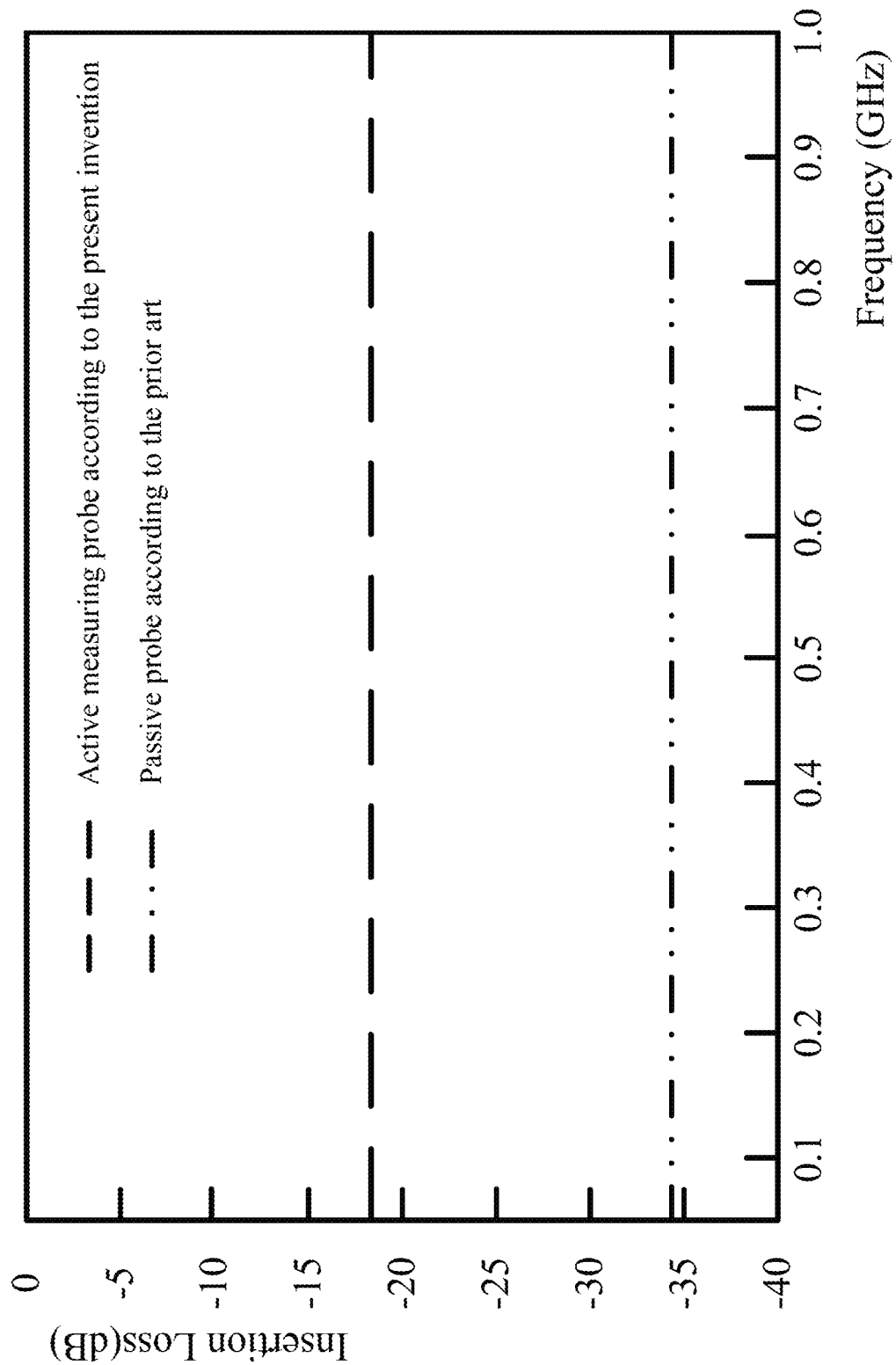
FIG. 2 shows a comparison chart of the insertion loss between the active measuring probe according to the present invention and the passive measuring probe according to the prior art.

Please refer to FIG. 2, which shows a comparison chart of the insertion loss between the active measuring probe according to the present invention and the passive measuring probe according to the prior art. As shown in the figure, since the active measuring probe 40 includes the 1Ω resistor and the amplifier 41, the insertion loss can be reduced from around 34 dB to around 18 dB (according to an embodiment without 49Ω resistor). Thereby, the input terminal and output terminal of the active measuring probe 40 can have impedance match. Besides, the active measuring probe 40 can be integrated to the integrated circuit IC or used with commercial ICs.

Figure 3:
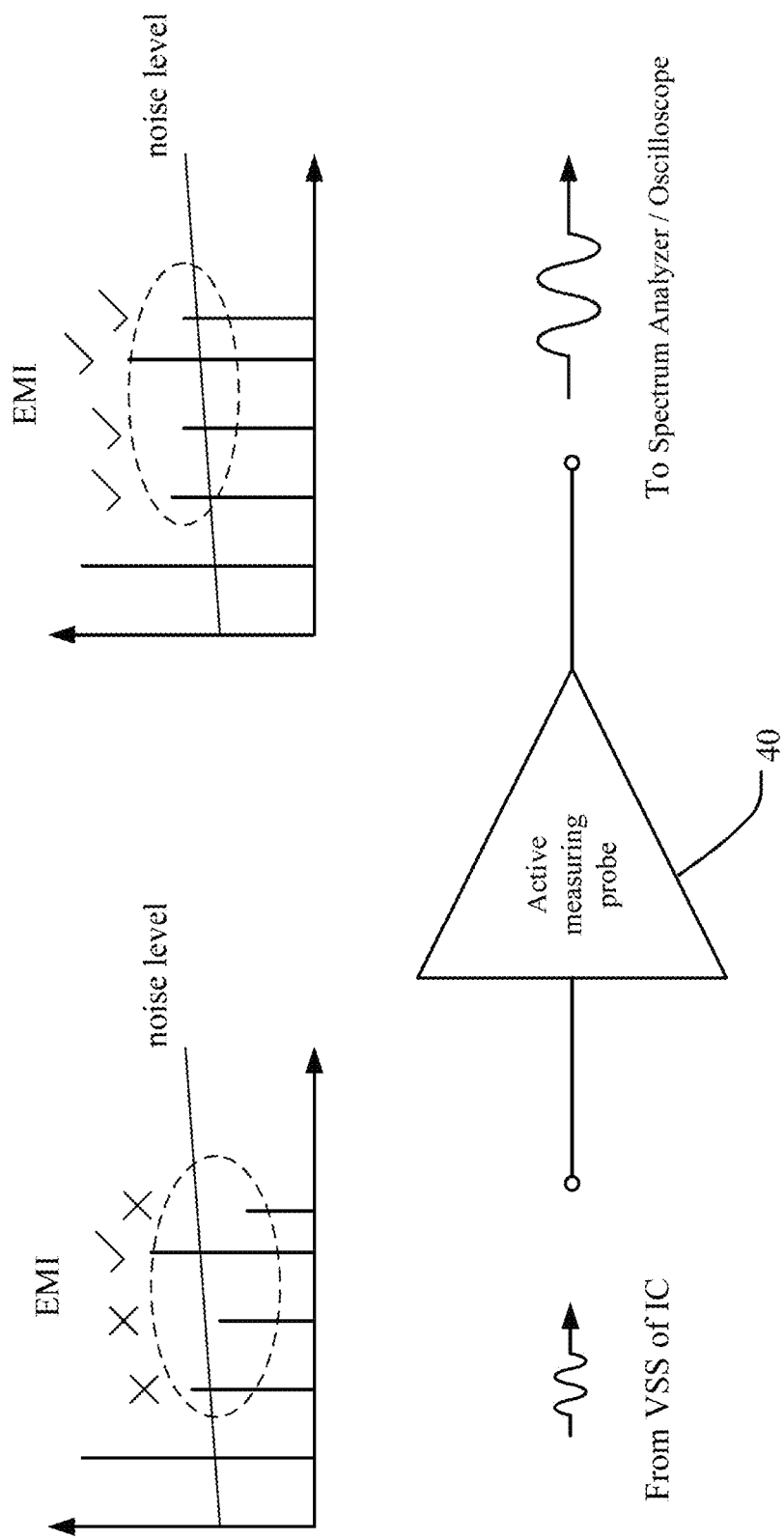
FIG. 3 shows a schematic diagram of the noise detection ability of the active measuring probe according to the present invention.

Please refer to FIG. 3, which shows a schematic diagram of the noise detection ability of the active measuring probe according to the present invention. As shown in the figure, the active measuring probe 40 measures the EMI that is under the noise level of the testing machine 30 and normally ignored. The noise level represents the average noise level (DANL) display by equipment (such as the testing machine 30). The current probe head of the active measuring probe 40 should be designed to have an accurate 1Ω input impedance with high transimpedance gain in a wide frequency range. In addition, the amplifier 41 should be designed to have low input impedance, high gain, and wide bandwidth from DC to giga hertz. Thereby, the active measuring probe 40 is formed by two parts, namely, the high-precision 1Ω resistor and the wide bandwidth amplifier 41.

Figure 4:
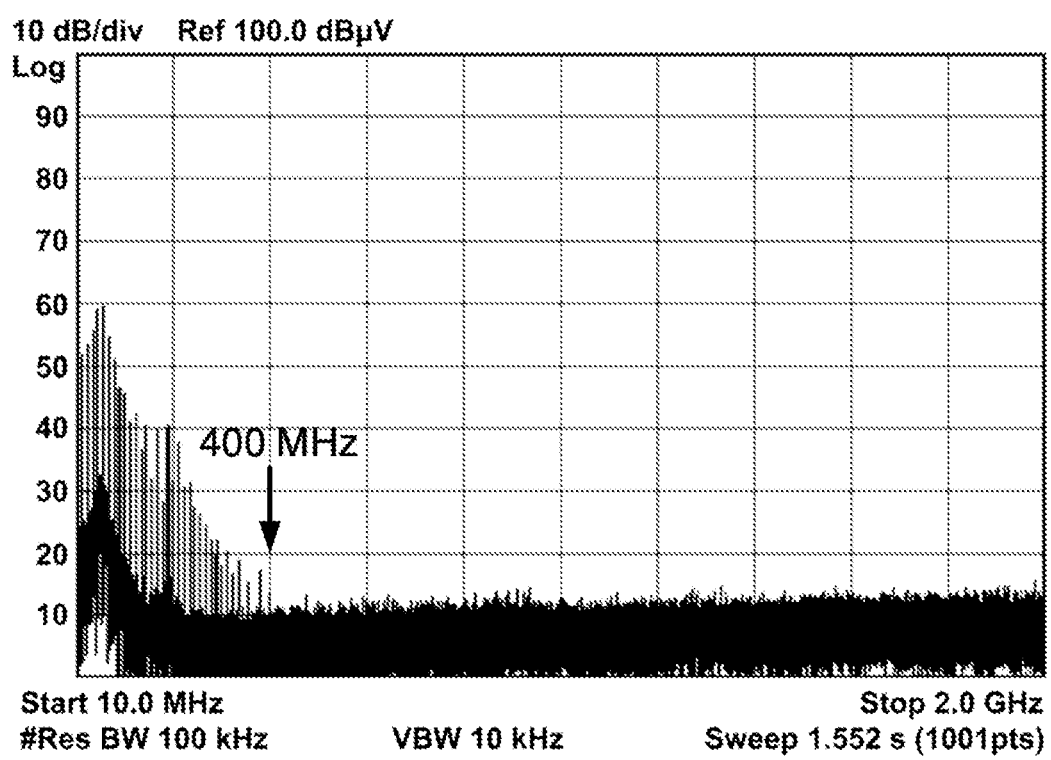
FIG. 4 shows a spectrum diagram of the EMI measurement result of the passive measuring probe according to the prior art.

Please refer to FIG. 4, which shows a spectrum diagram of the EMI measurement result of the passive measuring probe according to the prior art. Under the regulation of the IEC standards, the figure shows the frequency spectrum measured by a certified passive 1Ω probe. In addition, according to the IEC standards, the RBW and VBW of the frequency analyzer are set to 100 kHz and 10 kHz, respectively. Hence, the observed interference is mainly below 400 MHz. In other words, the integrated circuit IC (or other DUTs such as an MCU) might be considered to generate no noise above 400 MHz. The scanning time for measurement is approximately 1.552 seconds.

Figure 5:
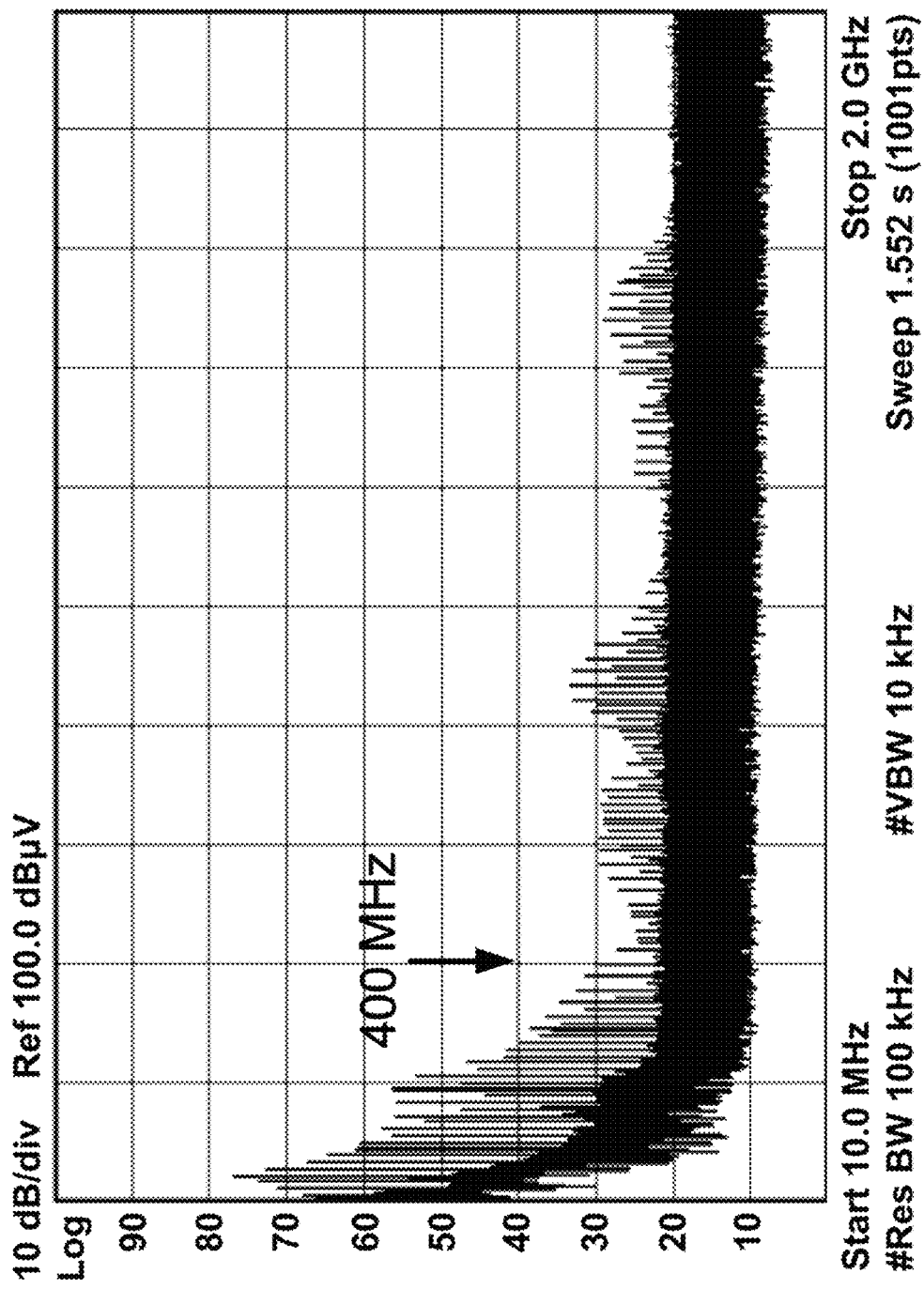
FIG. 5 shows a spectrum diagram of the EMI measurement result of the active measuring probe according to the present invention.

Please refer to FIG. 5, which shows a spectrum diagram of the EMI measurement result of the active measuring probe according to the present invention. The figure shows the measurement result using the integrated CMOS active measuring probe 40 according to the present invention. By using the same RBW and VBW settings, high-frequency interference above 400 MHz can be observed apparently. The noise might interfere normal operations of the system. The scanning time of the active measuring probe 40 for measurement is approximately 1.552 seconds.

Please refer to FIG. 6, which shows a spectrum diagram for verifying the EMI measurement ability of the active measuring probe according to the prior art with the narrowed RBW and VBW setting. The frequencies of the RBW and VBW are reduced and the passive probe according to the prior art is used to measure EMI for verifying correctness of the EMI measurement result using the active measuring probe 40 according to the present invention. The RBW and VBW are reduced to 10 kHz and 1 kHz, respectively, for noise measurement. The noise level is reduced by 10 dB and the high-frequency interference not measurable by the passive probe according to the prior art appears in the frequency spectrum. Accordingly, there indeed exists high-frequency interference in the frequency band above 400 MHz. The scanning time for noise measurement is increased significantly to 155.2 second, which is 100 times larger than 1.552 seconds in FIG. 5, making the measurement not suitable for large-scale product testing. Comparing FIG. 5 and FIG. 6, it is known that the active measuring probe 40 according to the present invention can observe (or measure) the hidden interference under the noise level of the testing machine 30 in a reasonable time. Thereby, it can be adopted to ensure the source of problem for EMI in the high-speed integrated circuit IC.

To sum up, the present invention provides an active measuring probe with integrated amplifier used for measuring EMI in the giga hertz range. In addition, by integrating accurate 1Ω resistor and amplifier, the loss of the measuring probe is lower than 34 dB, which is the loss of the measuring probe according to the prior art. Furthermore, an active measuring probe owns superior noise detection ability than a passive measuring probe according to the prior art. The present invention relates to an active measuring probe for EMI detection, which comprises a first connecting member, an impedance element, an amplifier, and a second connecting member. The first connecting member is coupled to one terminal of the impedance element and an input terminal of the amplifier. The other terminal of the impedance element is coupled to a ground terminal. The second connecting member is coupled to an output terminal of the amplifier.

What is claimed is:

1. An active measuring probe for EMI detection, consisting of:

a first connecting member, having two terminals;

an impedance device, having two terminals coupled to said two terminals of said first connecting member and coupled to a ground terminal;

an amplifier, having one input terminal coupled to one of said two terminals of said first connecting member and one of said two terminals of said impedance device, the other one of said two terminals of said impedance device coupled to the other one of said two terminals of said first connecting member and coupled to said ground terminal; and a second connecting member, having two terminals, one of said two terminals of said second connecting member coupled to an output terminal of said amplifier, and the other one of said two terminals of said second connecting member coupled to the other terminal of said impedance device and coupled to the other one of said two terminals of said first connecting member;

wherein while the gain of said amplifier is increased, the loss of said active measuring probe is decreased.

2. The active measuring probe for EMI detection of claim 1, wherein said impedance device is a first resistor with resistance of 0.1~2Ω.

3. The active measuring probe for EMI detection of claim 1, wherein said impedance device is a first resistor with resistance of 1 Ω.

4. The active measuring probe for EMI detection of claim 1, wherein the gain of the amplifier is 0 dB~50 dB.

* * * * *